(12) United States Patent
Batcheller et al.

(10) Patent No.: US 7,957,152 B2
(45) Date of Patent: *Jun. 7, 2011

(54) CRASH-HARDENED MEMORY DEVICE AND METHOD OF CREATING THE SAME

(75) Inventors: Barry Douglas Batcheller, West Fargo, ND (US); Peder Alfred Nystuen, Fargo, ND (US); Robert Michael Allen, Reiles Acres, ND (US)

(73) Assignee: Appareo Systems, LLC, Fargo, ND (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/573,757

(22) Filed: Oct. 5, 2009

(65) Prior Publication Data

US 2010/0020512 A1    Jan. 28, 2010

Related U.S. Application Data

(63) Continuation of application No. 11/903,385, filed on Sep. 21, 2007, now Pat. No. 7,616,449.

(60) Provisional application No. 60/826,893, filed on Sep. 25, 2006.

(51) Int. Cl.
*H05K 5/00* (2006.01)

(52) U.S. Cl. .......................... 361/752; 361/800; 361/790

(58) Field of Classification Search .................. 361/752, 361/790, 730, 797, 800
See application file for complete search history.

(56) References Cited

U.S. PATENT DOCUMENTS

| | | | |
|---|---|---|---|
| 4,226,491 A | 10/1980 | Kazama et al. | |
| 4,470,116 A | 9/1984 | Ratchford | |
| 4,644,494 A | 2/1987 | Muller | |
| 4,694,119 A | 9/1987 | Groenewegen | |
| 4,944,401 A | 7/1990 | Groenewegen | |
| 5,123,538 A | 6/1992 | Groenewegen | |
| 5,438,162 A | 8/1995 | Thompson et al. | |
| 5,750,925 A | 5/1998 | Purdom | |
| 5,756,934 A | 5/1998 | Purdom | |
| 6,148,179 A | 11/2000 | Wright et al. | |
| 6,160,998 A | 12/2000 | Wright et al. | |
| 6,163,681 A | 12/2000 | Wright et al. | |
| 6,167,238 A | 12/2000 | Wright | |
| 6,167,239 A | 12/2000 | Wright et al. | |

(Continued)

FOREIGN PATENT DOCUMENTS

CA    2305633    10/2001

(Continued)

*Primary Examiner* — Hung S Bui

(74) *Attorney, Agent, or Firm* — Jonathan Tolstedt; Mark E. Brown

(57) ABSTRACT

A crash-hardened memory device in which only a single electronic component, such as a memory chip, mounted on a small printed circuit board (PCB), is protected against an impact. The portion of the PCB containing the electronic component is wrapped in fire-retardant material. The wrapped PCB assembly is placed in a rigid, hardened enclosure which provides an environmental seal for the portion of the PCB containing the electronic component. A portion of the PCB extends outside of the enclosure to allow electrical connections to be made to the electronic component contained inside. A score line is created on the PCB to create an acceptable shear point between the internal and external portions of the PCB in the event of a crash. Threaded fasteners extend through and beyond both enclosure halves to provide a means for mounting the crash-hardened memory device on an external surface.

5 Claims, 4 Drawing Sheets

U.S. PATENT DOCUMENTS

| | | |
|---|---|---|
| 6,173,159 B1 | 1/2001 | Wright et al. |
| 6,353,734 B1 | 3/2002 | Wright et al. |
| 6,397,128 B1 | 5/2002 | Todd |
| D470,450 S | 2/2003 | Olzak |
| 6,721,640 B2 | 4/2004 | Glenn et al. |
| 6,762,942 B1 | 7/2004 | Smith |
| 6,822,161 B2 | 11/2004 | Komatsu et al. |
| 6,867,367 B2 | 3/2005 | Zimmerman |
| 6,898,492 B2 | 5/2005 | de Leon et al. |
| 7,020,708 B2 | 3/2006 | Nelson et al. |
| 7,023,695 B2 | 4/2006 | McCollum et al. |
| 7,177,939 B2 | 2/2007 | Nelson et al. |
| 7,203,630 B2 | 4/2007 | Kolb et al. |
| 7,333,343 B2 | 2/2008 | Olzak |
| 7,356,389 B2 | 4/2008 | Holst et al. |
| 7,616,449 B2 * | 11/2009 | Batcheller et al. ............ 361/752 |
| 2005/0220055 A1 | 10/2005 | Nelson et al. |
| 2006/0057974 A1 | 3/2006 | Ziarno et al. |
| 2006/0176651 A1 | 8/2006 | Olzak |
| 2007/0100516 A1 | 5/2007 | Olzak |

FOREIGN PATENT DOCUMENTS

| | | |
|---|---|---|
| EP | 0445270 | 10/1992 |
| EP | 1053290 | 3/2003 |
| WO | WO-8503583 | 8/1985 |
| WO | WO-9104525 | 4/1991 |
| WO | WO-9104921 | 4/1991 |
| WO | WO-0160693 | 8/2001 |
| WO | WO-2004045106 | 5/2004 |
| WO | WO-2007046831 | 4/2007 |

\* cited by examiner

CRASH-HARDENED MEMORY DEVICE AND METHOD OF CREATING THE SAME

CROSS-REFERENCE TO RELATED APPLICATIONS

This application is a continuation of and claims the benefit of U.S. patent application Ser. No. 11/903,385 entitled "Crash-Hardened Memory Device and Method of Creating the Same," filed Sep. 21, 2007 now U.S. Pat. No. 7,616,449, which claims the benefit of U.S. Provisional Patent Application No. 60/826,893, entitled "Fleet Operations Quality Management System," filed Sep. 25, 2006, which are incorporated herein by reference.

BACKGROUND OF THE INVENTION

1. Field of the Invention

This invention pertains to a method and apparatus for protecting the integrity of a memory device in the event of a crash or the destruction of the system containing that memory device.

2. Description of the Related Art

Various inventions exist for the protection of electronic assemblies embedded in a vehicle in the event of the crash or destruction of that vehicle. Flight data recorders for commercial aircraft, for example, are typically enclosed in an environmentally-sealed metal enclosure made of a material such as titanium to survive tremendous impact forces. These "black boxes", as they are often called, are mandated by the FAA to survive penetration, impact, and high temperature. Because of these stringent requirements, these crash-hardened electronic devices are prohibitively expensive for fleets of smaller aircraft or ground vehicles, which may or may not have federal requirements for continuous data recording.

Most products in the prior art utilize elaborate mechanisms for protecting entire electronic assemblies from damage or heat due to crash-related fires. Some encapsulate the electronic assembly in enclosures with cavities filled with liquid or chemicals designed to dissipate or absorb heat. While these methodologies may provide adequate protection for the circuits or electronic devices, the resulting enclosures are large and bulky and will not work for applications requiring smaller, self-contained or handheld data recording devices.

What is needed in the art is a device which will adequately protect a solid state memory device, but which is small and compact enough to fit inside of a small, self-contained or handheld electronic device.

SUMMARY OF THE INVENTION

Accordingly, it is one objective of the invention to describe a method of encapsulating a solid state memory chip or similar electronic component in a compact crash-hardened enclosure small enough to be mounted directly onto a printed circuit board or the interior of a small, self-contained or handheld electronics device enclosure.

It is another objective of the invention to describe a device which will provide protection from the impact forces and fire/heat hazards of a crash for a solid state memory chip or similar electronic component.

It is yet another objective of the invention to fully encapsulate and isolate a solid state memory chip or similar electronic component such that, in the event of a crash, it can break away cleanly from the encompassing electronic device of which it is a part and survive until the data contained within can be recovered.

Further objectives and advantages of the invention will become apparent from a consideration of the drawings and ensuing description.

In accordance with the present invention, a crash-hardened memory device includes an electronic component such as a memory device mounted on a small printed circuit board (PCB), the PCB being sized such that it just contains the electronic component and any required circuit traces leading from the electronic component. The portion of the PCB containing the electronic component is wrapped first in fire retardant material, then in RF shielding tape. The wrapped PCB assembly is placed in the first half of a metallic outer enclosure, and the second half of the enclosure is placed on top of the first half such that the wrapped PCB assembly is sandwiched between the two halves. The non-wrapped portion of the PCB extends out through a slot between the enclosure halves, allowing external connections to be made to the exposed portion of the PCB. A sealant/adhesive is placed between the two enclosure halves and around the PCB slot to provide an environmental seal. Screws are placed into the assembly to fasten the two enclosure halves together. Two or more of the screws may extend through the completed assembly to provide a means for fastening the assembly to a second PCB or the interior of an outer enclosure. A thin score line is made on the exposed part of the PCB to create an acceptable shearing point for the PCB in the event of a crash.

DETAILED DESCRIPTION OF THE PREFERRED EMBODIMENT

Figure 1:
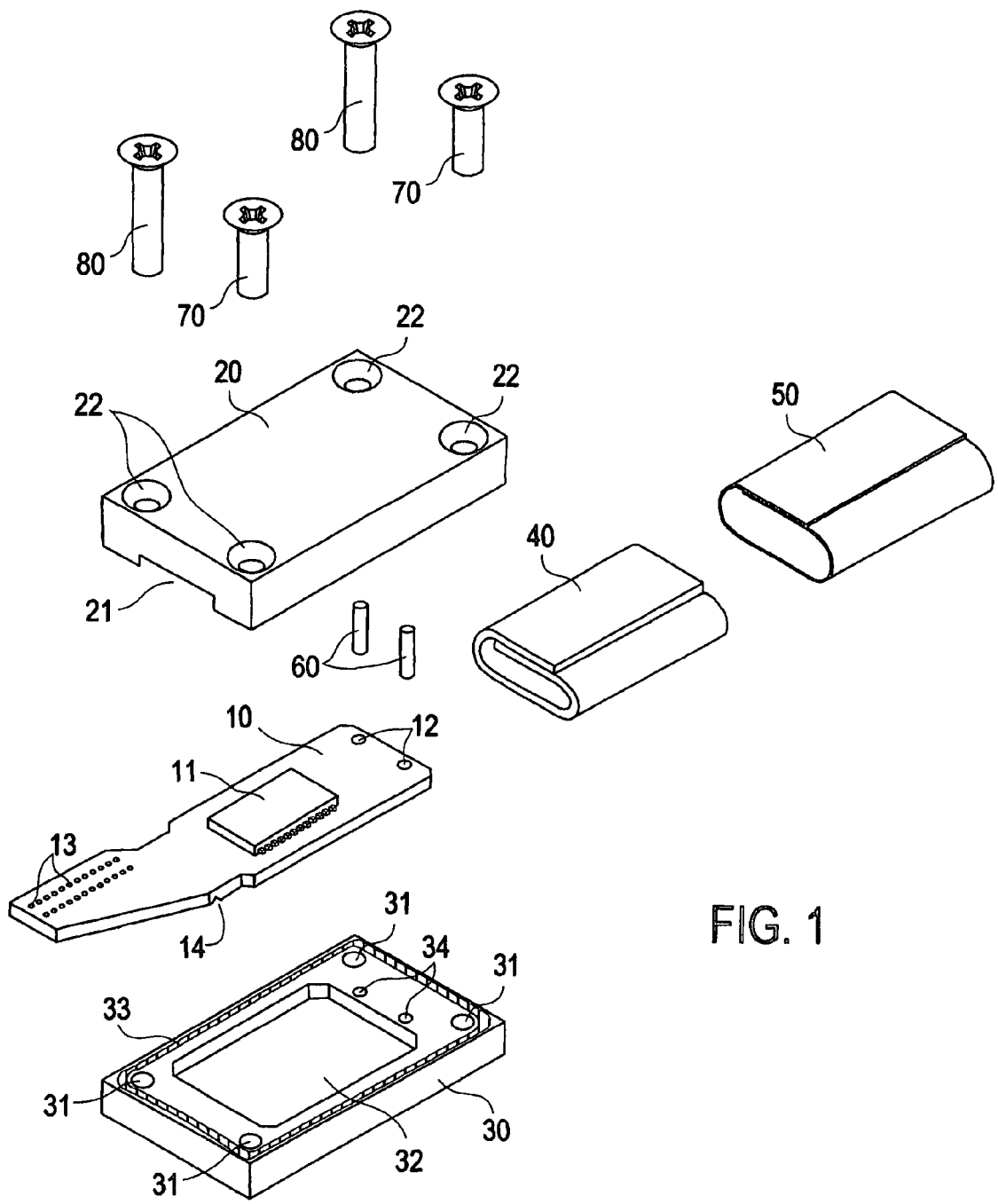
FIG. 1 is an exploded, perspective view of one implementation of a crash-hardened memory device.

FIG. 1 is an exploded, perspective view of one implementation of a crash-hardened memory device. In this implementation, an electronic component 11 such as a flash memory device is mounted on a printed circuit board (PCB) 10. The PCB 10 can be any appropriate size, but in this implementation is only slightly larger than the electronic component 11 and the corresponding electrically-conductive circuit traces, which are not shown, but which are inherent in any printed circuit board, as is apparent to one skilled in the arts. The PCB 10 has a plurality of connector receptacles 13 which can be used to make electrical connections to other electronic or electrical components in a system. These other electronic or electrical components are not shown and are not part of the present invention. The PCB 10 also has a plurality of board locator holes 12 which are used to position the PCB 10 in relation to other components, as will become apparent below. A score line 14 is cut across one side of the PCB 10 to provide an acceptable shear point if the crash-hardened memory device is subjected to an impact. A score line is a shallow trough cut across the surface of a printed circuit board that does not extend all of the way through the printed circuit board. A score line is typically V-shaped, but can be any appropriate shape. The purpose of a score line is to provide a line or area of material that is thinner than the surrounding material, such that the printed circuit board is most likely to break directly along the score line when force is applied on either side of the score line. A better view of the score line 14 can be seen on FIG. 4, which will be described shortly.

Referring back to FIG. 1, the PCB 10 is wrapped in a layer of fire retardant material 40. The fire retardant material 40 is placed around PCB 10 such that the electronic component 11 is completely covered, and such that the score line 14, connector receptacles 13, and board locator holes 12 are not covered. In one implementation, the fire retardant material 40 is a carbon-fiber batting, such as the CarbonX BOO nonwoven needle punch fabric commercially available from Chapman Thermal Products. However, any appropriate fire retardant material can be used. Once the PCB 10 is wrapped in the fire retardant material 40, a securing means 50 is further wrapped around the fire retardant material 40 to keep it in place. In one implementation, the securing means 50 is a multipurpose radio frequency (RF) shielding aluminum foil tape which provides a level of shielding against stray radio frequencies and magnetic fields in addition to holding the fire retardant material 40 in place. However, any appropriate means of securing the fire retardant material can be used, with or without the additional RF shielding.

The PCB 10, wrapped in fire retardant material 40 and securing means 50, is placed in a recess 32 in a bottom enclosure half 30. The end of PCB 10 containing the connector receptacles 13 extends beyond the bottom enclosure half 30 when the PCB 10 is properly positioned. A plurality of dowel pins 60 extend through board locator holes 12 in PCB 10 and into dowel holes 34 in bottom enclosure half 30. Top enclosure half 20 contains a duplicate set of dowel holes 34 and recess 32 (not shown) which are positioned such that they line up with the corresponding features in bottom enclosure half 30. The dowel pins 60 secure the PCB 10 so that the PCB 10 is not moved significantly by the dissipation of kinetic energy across the assembly during an impact. In one implementation, the dowel pins 60, top enclosure half 20, and bottom enclosure half 30 are made of SAE-AMS-5640 Type 1 material (303 Stainless Steel). However, any appropriate impact-resistant material can be used to form these components.

An adhesive bead 33 is placed between the top enclosure half 20 and the bottom enclosure half 30 to provide a watertight seal. The adhesive bead 33 is also placed around the perimeter of notch 21 in top enclosure half 20 to provide a watertight seal around PCB 10. In one implementation, the adhesive bead 33 is an RTV silicone adhesive, however any appropriate adhesive or sealing material may be used. A plurality of short fasteners 70 and long fasteners 80 are placed into recessed fastener holes 22 in top enclosure half 20, and extend down into threaded holes 31 in bottom enclosure half 30. Long fasteners 80 are sized such that they extend all the way through and beyond bottom enclosure half 30 to provide a means to fasten the fully assembled module to another device. Long fasteners 80 are designed in a manner and of a material which will allow them to shear in the event of an impact, fully isolating the crash-hardened memory device from the external system to which it has been mounted.

Figure 2:
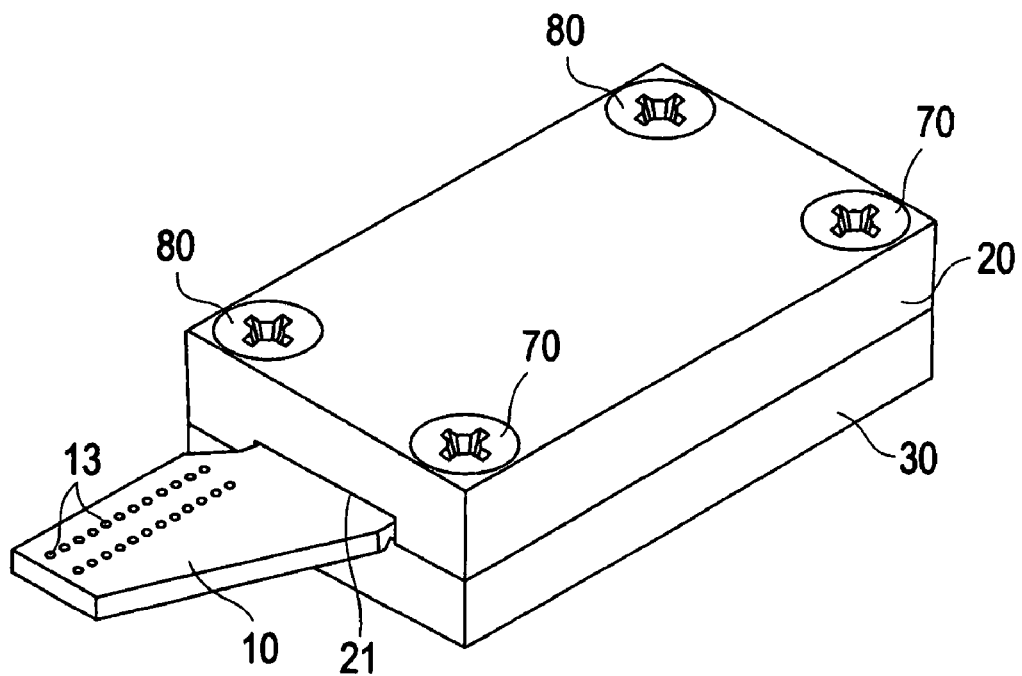
FIG. 2 is a perspective view of the fully-assembled crash-hardened memory device of FIG. 1.
Figure 3:
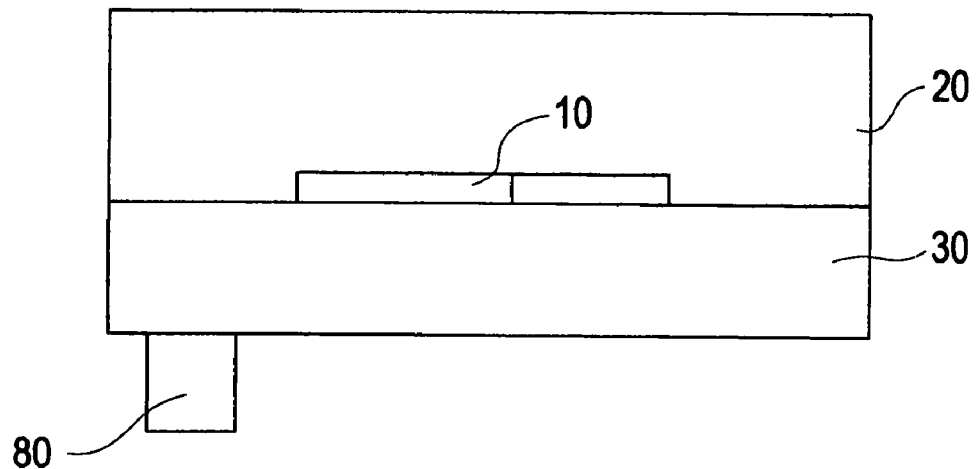
FIG. 3 is a front orthogonal view of the fully-assembled crash-hardened memory device of FIG. 2.

FIG. 2 and FIG. 3 each provide alternate views of the fully assembled crash-hardened memory device. FIG. 2 is a perspective view showing the end of PCB 10 extending through notch 21. The connector receptacles 13 are accessible from the end of PCB 10, and can be used to make electrical connections to other system components. Long fasteners 80 and short fasteners 70 are shown as they appear in the final assembly. FIG. 3 shows a front orthogonal view of the fully-assembled crash-hardened memory device, showing how long fasteners 80 extend outside of bottom enclosure half 30.

Figure 4:
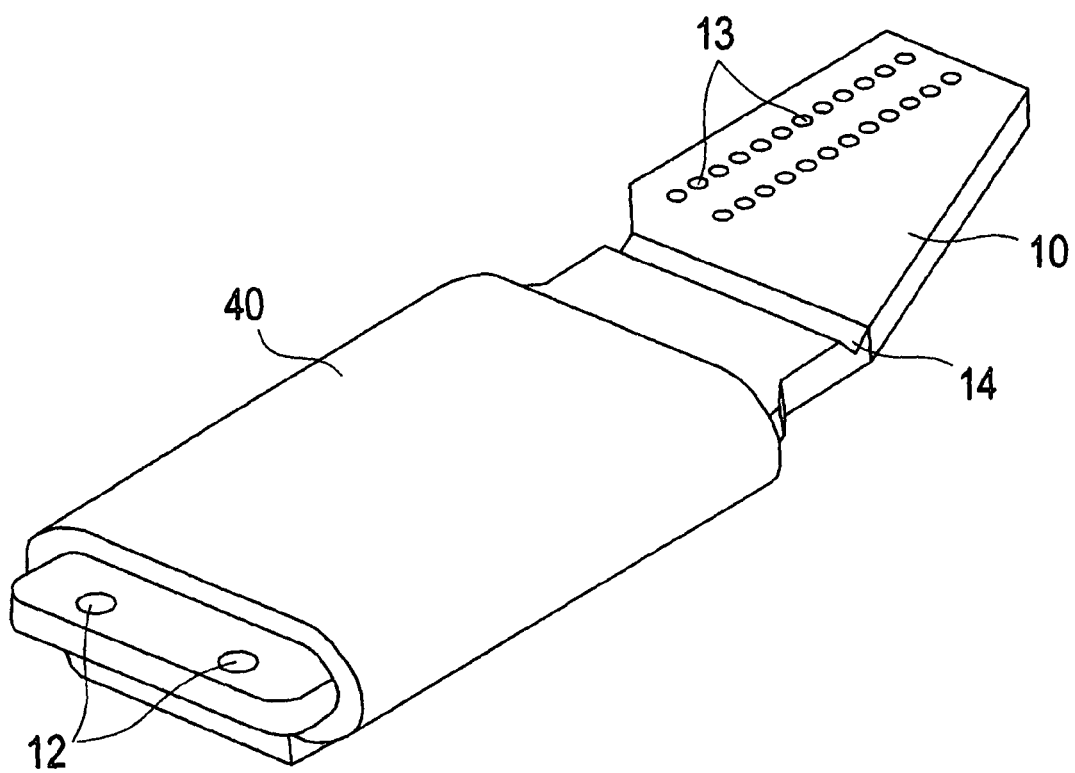
FIG. 4 is an alternate perspective view of the printed circuit board and insulating material which are components of the crash-hardened memory device of FIGS. 1 and 2.

FIG. 4 shows an alternate perspective view of the PCB 10 wrapped in fire retardant material 40. Score line 14 is shown more clearly in this view. When the crash-hardened memory device is fully assembled, score line 14 is placed such that it lines up with the external edge of top enclosure half 20 and bottom enclosure half 30. If the PCB 10 was impacted on its end extending outside of the fully-assembled module, near connector receptacles 13, the external piece of PCB 10 will shear off along score line 14, allowing the fully-assembled module to maintain its environmental seal.

Figure 5:
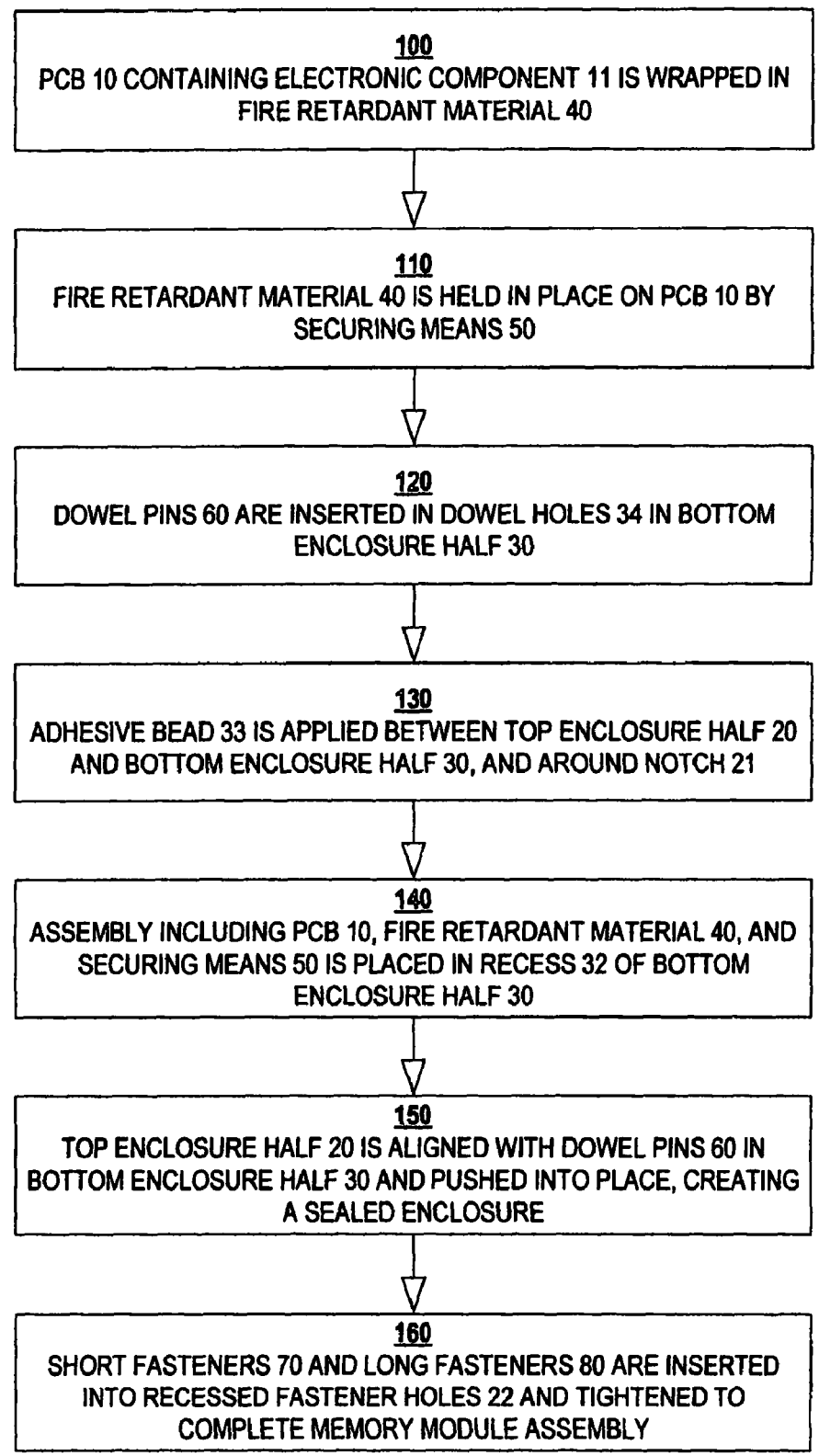
FIG. 5 is a flowchart detailing the steps required to create the fully-assembled crash hardened memory device of FIG. 2.

FIG. 5 is a flowchart detailing the steps required to create the fully-assembled crash hardened memory device. PCB 10 containing electronic component 11 is wrapped in fire retardant material 40 (Step 100). Fire retardant material 40 is then held in place on PCB 10 by securing means 50 (Step 110). Dowel pins 60 are inserted into dowel holes 34 in the bottom enclosure half 30 (Step 120). An adhesive bead 33 is applied to top enclosure half 20 and bottom enclosure half 30, and around notch 21 in top enclosure half 20 (Step 130). The assembly of PCB 10, fire retardant material 40, and securing means 50 is then placed in recess 32 in the bottom enclosure half 30 (Step 140). Dowel holes 34 in top enclosure half 20 are aligned with dowel pins 60 and the top enclosure half is pushed into placed on top of bottom enclosure half 30, creating a sealed enclosure (Step 150). Finally, long fasteners 80 and short fasteners 70 are inserted into recessed fastener holes 22 in top enclosure half 20 and driven down into threaded holes 31 in bottom enclosure half 30 (Step 160). It is obvious to one skilled in the arts that there are variations to the order of the steps detailed in FIG. 5 which can be used to achieve the same final product.

Having described the preferred embodiment, it will become apparent that various modifications can be made without departing from the scope of the invention as defined in the accompanying claims. In particular, the enclosure described herein can be of any appropriate size and material, and can be placed around multiple electronic components. For instance, the enclosure could be placed around both a memory device and a microprocessor, which itself may have on-board memory. In an alternate embodiment, the crash-hardened memory device could be designed such that it will float, so that it would travel to the surface in the event it broke away from the host system in the event of a water impact. This may be done by changing the material of the enclosure, or by designing the enclosure to contain air chambers.

Having thus described the invention, what is claimed as new and desired to be secured by Letters Patent is:

1. A method for creating a crash-hardened memory device, comprising the steps of:
   creating a printed circuit board assembly comprising the steps of creating a printed circuit board comprising a first portion and a second portion, wherein said second portion contains exposed connector receptacles which are electrically connected to said first portion, receivably mounting at least one electronic component on said first portion of said printed circuit board, electrically connecting said connector receptacles to said electronic component, and encapsulating said first portion of said printed circuit board and said at least one electronic component, but not said second portion of said printed circuit board, in a fire-retardant material,
   placing a score line along and extending said score line entirely across the boundary between said first and second portions of said printed circuit board, whereby an impact to the crash-hardened memory device would enable the second portion of said printed circuit board to break away cleanly from said first portion of separate circuit board along said score line;

placing said printed circuit board assembly in a first enclosure half, wherein said first portion of said printed circuit board is contained within said first enclosure half, and said second portion of said printed circuit board extends outside of said first enclosure half;

placing a second enclosure half on top of said first enclosure half, creating a complete environmental seal around said first portion of said printed circuit board, wherein said second portion of said printed circuit board extends outside said complete environmental seal; and fastening said first enclosure half to said second enclosure half.

2. The method for creating a crash-hardened memory device of claim 1, wherein said fastening step comprises inserting a plurality of threaded fastening devices through said first enclosure half and said second enclosure half.

3. The method for creating a crash-hardened memory device of claim 2, wherein at least a portion of said plurality of threaded fastening devices extend beyond said crash-hardened memory device, whereby the extending length of said at least a portion of said plurality of threaded fastening devices can be used to attach said crash-hardened memory device to an external surface.

4. The method for creating a crash-hardened memory device of claim 1 wherein said fastening step further comprises spreading an adhesive material on the interfacing surfaces of said first enclosure half and said second enclosure half.

5. The method for creating a crash-hardened memory device of claim 4 further comprising the step of inserting a plurality of dowel pins, such that said plurality of dowel pins extends from holes in said first enclosure half through said printed circuit board assembly into holes in said second enclosure half, whereby said plurality of dowel pins prevent said circuit board assembly from moving significantly by the dissipation of kinetic energy across said crash-hardened memory device during an impact.

* * * * *